United States Patent
Won

(10) Patent No.: US 9,460,765 B2
(45) Date of Patent: Oct. 4, 2016

(54) SEMICONDUCTOR APPARATUS HAVING CONTROL BLOCK GENERATING COLUMN SELECT SIGNAL AND OVERDRIVE SIGNAL

(71) Applicant: SK hynix Inc., Icheon-si Gyeonggi-do (KR)

(72) Inventor: Hyung Sik Won, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 6 days.

(21) Appl. No.: 14/540,813

(22) Filed: Nov. 13, 2014

(65) Prior Publication Data

US 2016/0071560 A1 Mar. 10, 2016

(30) Foreign Application Priority Data

Sep. 5, 2014 (KR) .................. 10-2014-0118862

(51) Int. Cl.
  *G11C 7/00* (2006.01)
  *G11C 7/12* (2006.01)
  *G11C 7/10* (2006.01)
  *G11C 7/22* (2006.01)

(52) U.S. Cl.
  CPC .............. *G11C 7/12* (2013.01); *G11C 7/1093* (2013.01); *G11C 7/1096* (2013.01); *G11C 7/222* (2013.01); *G11C 2207/005* (2013.01)

(58) Field of Classification Search
  CPC .................................. G11C 7/12; G11C 7/22
  USPC ................. 365/189.05, 189.15, 189.17, 191
  See application file for complete search history.

(56) References Cited

U.S. PATENT DOCUMENTS

| | | | | |
|---|---|---|---|---|
| 5,841,717 A | * | 11/1998 | Yamaguchi | G11C 11/4096 365/194 |
| 7,613,059 B2 | * | 11/2009 | Kang | G11C 11/4091 365/204 |
| 2010/0085819 A1 | * | 4/2010 | Lee | G11C 8/18 365/189.11 |

FOREIGN PATENT DOCUMENTS

| KR | 1020050041055 A | 5/2005 |
|---|---|---|
| KR | 1020060039241 A | 5/2006 |

\* cited by examiner

*Primary Examiner* — Tha-O H Bui
(74) *Attorney, Agent, or Firm* — William Park & Associates Ltd.

(57) ABSTRACT

A semiconductor apparatus includes a control block configured to control a pulse width of a column select signal in response to a precharge command from an external; and a coupling block configured to electrically couple bit lines and data lines according to the column select signal. A semiconductor apparatus includes a control block configured to generate a drive signal in response to a write command and generate an overdrive signal in response to a precharge command; and a driver configured to drive data lines with a first voltage in response to the drive signal and overdrive the data lines with a second voltage higher than the first voltage in response to the overdrive signal.

20 Claims, 8 Drawing Sheets

SEMICONDUCTOR APPARATUS HAVING CONTROL BLOCK GENERATING COLUMN SELECT SIGNAL AND OVERDRIVE SIGNAL

CROSS-REFERENCES TO RELATED APPLICATION

The present application claims priority under 35 U.S.C. §119(a) to Korean application number 10-2014-0118862, filed on Sep. 5, 2014, in the Korean Intellectual Property Office, which is incorporated herein by reference in its entirety.

BACKGROUND

1. Technical Field

Various embodiments generally relate to a semiconductor apparatus, and more particularly, to a semiconductor apparatus which performs a precharge operation after performing a write operation.

2. Related Art

Semiconductor apparatuses, specifically, semiconductor memory apparatuses may be used to store data. Memory apparatuses may be generally divided into a nonvolatile type and a volatile type.

A nonvolatile memory apparatus may retain stored data even though power is not applied. The nonvolatile memory apparatus may include a flash memory apparatus such as a NAND flash and a NOR flash, an FeRAM (ferroelectric random access memory), a PCRAM (phase change random access memory), an MRAM (magnetic random access memory) or an ReRAM (resistive random access memory).

A volatile memory apparatus may not retain and lose stored data when power is not applied. The volatile memory apparatus may include an SRAM (static random access memory) or a DRAM (dynamic random access memory). The volatile memory apparatus may be generally used as a buffer memory apparatus, a cache memory apparatus, a working memory apparatus, or the like, in a data processing system, based on a relatively high processing speed.

SUMMARY

In an embodiment, a semiconductor apparatus may include a control block configured to control a pulse width of a column select signal when a precharge command is sensed. The semiconductor apparatus may also include a coupling block configured to electrically is couple bit lines and data lines according to the column select signal.

In an embodiment, a semiconductor apparatus may include a control block configured to generate an overdrive signal when a precharge command is sensed. The semiconductor apparatus may also include a driver configured to overdrive data lines in response to the overdrive signal.

In an embodiment, a semiconductor apparatus may include a control block configured to control a pulse width of a column select signal and generate an overdrive signal when a precharge command is sensed. The semiconductor apparatus may also include a driver configured to overdrive data lines according to the overdrive signal. Further, the semiconductor apparatus may include a coupling block configured to electrically couple bit lines and the data lines according to the column select signal.

DETAILED DESCRIPTION

Hereinafter, a semiconductor apparatus will be described below with reference to the accompanying figures through various is embodiments.

Figure 1:
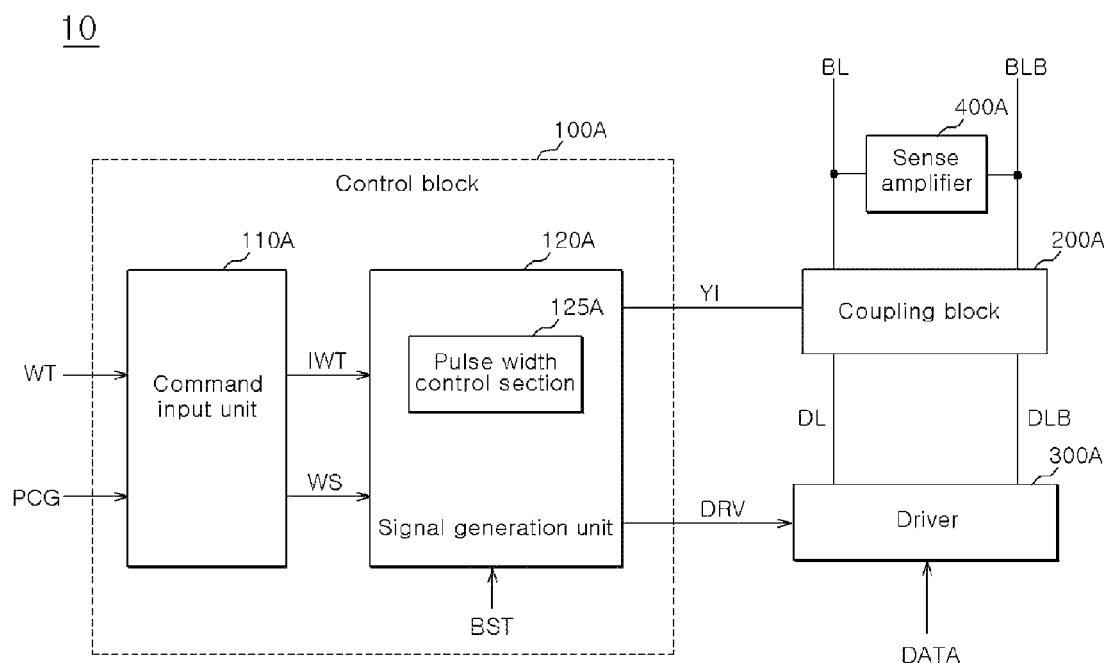
FIG. 1 is a block diagram schematically illustrating a representation of an example of a semiconductor apparatus in accordance with an embodiment.

Referring to FIG. 1, a block diagram schematically illustrating a representation of an example of a semiconductor apparatus 10 in accordance with an embodiment is described.

The semiconductor apparatus 10 may include a control block 100A configured to control the pulse width of a column select signal YI in the case where a precharge command PCG is sensed. A coupling block 200A is configured to electrically couple bit lines BL and BLB and data lines DL and DLB in response to the column select signal YI.

The control block 100A may sense the precharge command PCG provided from an external device. The control block 100A may control the pulse width of the column select signal YI, such that data may be quickly and stably stored in a memory cell before a bit line precharge operation by the precharge command PCG is performed. The control block 100A may control the pulse width of the column select signal YI generated in write operation periods occurring from when the precharge command PCG is provided to before the bit line precharge operation is performed. Each of the write operation periods may be an operation period to write data in a memory cell.

According to an embodiment, the control block 100A may to sense the precharge command PCG provided from the external device. The control block 100A may control the pulse width of the column select signal YI in a last write operation period before the precharge operation is performed. The last write operation period may be an operation period to write last write data in a memory cell before the bit line precharge operation by the precharge command PCG is performed. The last write data may be data to be written last before the bit line precharge operation is performed.

The control block 100A may include a command input unit 110A and a signal generation unit 120A.

The command input unit 110A may generate an internal write signal IWT in response to a write command WT provided from the external device. The command input unit 110A may generate a write strengthening signal WS in response to the precharge command PCG provided from the external device. More specifically, the command input unit 110A may enable the write strengthening signal WS in the case where the precharge command PCG is sensed.

The signal generation unit 120A may generate the column select signal YI in response to the internal write signal IWT. The signal generation unit 120A may control the pulse width of the column select signal YI in response to the write strengthening signal WS. For example, the signal generation unit 120A may generate the column select signal YI. The signal generation unit 120A may output the column select signal YI by controlling the pulse width of the column select signal YI, in the case where the internal write signal IWT and the write strengthening signal WS are enabled.

According to an embodiment, the signal generation unit 120A may control the pulse width of the column select signal YI corresponding to the last write data, in the last write operation period, in response to the write strengthening signal WS. The signal is generation unit 120A may refer to, for example, burst length information, to identify the last write operation period.

The signal generation unit 120A may include a pulse width control section 125A configured to control the pulse width of the column select signal YI in response to the write strengthening signal WS.

The signal generation unit 120A may generate a drive signal DRV in response to the internal write signal IWT.

The coupling block 200A may electrically couple the bit lines BL and BLB and the data lines DL and DLB in response to the column select signal YI.

The semiconductor apparatus 10 may further include a driver 300A. The driver 300A may be configured to drive the data lines DL and DLB in response to the drive signal DRV and transmit data. The data transmitted to the data lines DL and DLB may be transmitted to the bit lines BL and BLB as the coupling block 200A electrically couples the data lines DL and DLB and the bit lines BL and BLB in response to the column select signal YI.

The semiconductor apparatus 10 may further include a sense amplifier 400A. The sense amplifier 400A may be configured to sense and amplify the data loaded on the bit lines BL and BLB.

The bit lines BL and BLB may include a bit line BL and a bit line bar BLB. The bit lines BL and BLB may be electrically coupled to a memory cell. In addition, the bit lines BL and BLB may transfer data to the memory cell or may be transferred with data from the memory is cell.

The data lines DL and DLB may include a data line DL and a data line bar DLB.

While one pair of bit lines BL and BLB are shown in FIG. 1 for the sake of convenience in explanation, it is to be noted that the semiconductor apparatus 10 may include a plurality of memory cells and a plurality of pairs of bit lines electrically coupled to the respective memory cells. In this instance, the signal generation unit 120A may generate a plurality of column select signals YI respectively corresponding to the plurality of pairs of bit lines.

Figure 2A:
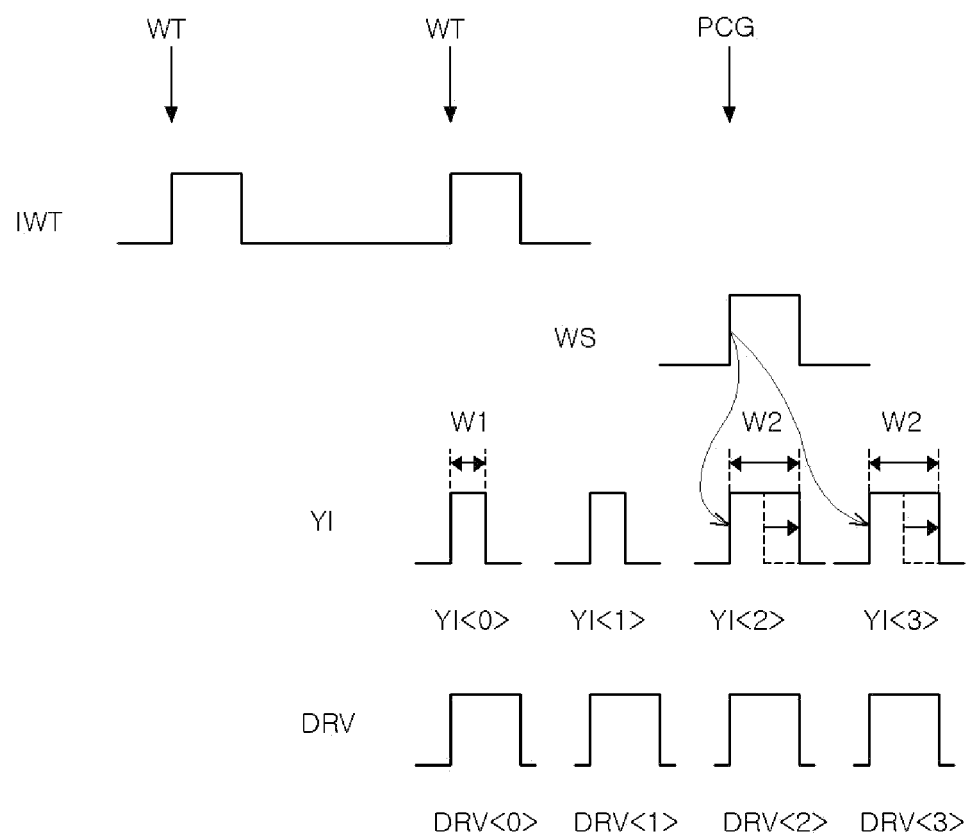
FIG. 2A is a representation of an example of a timing to diagram to assist in the explanation of an operation method of the semiconductor apparatus shown in FIG. 1.

Referring to FIG. 2a, a representation of an example of a timing diagram to assist in the explanation of an operation method of the semiconductor apparatus 10 shown in FIG. 1 is described. Further, referring to FIG. 2b, a representation of an example of a timing diagram to assist in the explanation of another operation method of the semiconductor apparatus 10 shown in FIG. 1 is described. Referring to FIG. 3, a representation of an example of a waveform diagram to assist in the explanation of changes in the voltage levels of the bit lines BL and BLB is described.

Hereinbelow, an operation method, for the semiconductor to apparatus 10 performing a write operation in response to the write command WT to write quickly and stably write data in a memory cell before performing the bit line precharge operation in response to the precharge command PCG, will be described with reference to FIGS. 1, 2a, 2b and 3 accordingly.

If the write operation is started, the bit lines BL and BLB which are precharged may be transferred with data from a memory cell through charge sharing. The sense amplifier 400A may sense and amplify the data loaded on the bit lines BL and BLB.

The command input unit 110A may generate the internal write signal IWT in response to the write command WT provided from the external device.

The signal generation unit 120A may generate the column select signal YI in response to the internal write signal IWT. The signal generation unit 120A may generate, for example, a plurality of column select signals YI<0:3> according to a burst length. Drive signals DRV <0:3> are also illustrated in the figures mentioned above such as FIG. 2A. The signal generation unit 120A may generate a column select signal (for example, the column select signal YI<0>) of a first pulse width W1 in the case where the precharge command PCG is not yet provided to the semiconductor apparatus 10, that is, in the case where the write strengthening signal WS is not enabled. The signal generation unit 120A may generate a plurality of column select signals (for example, the column select signals YI<0:1>) in response to the internal write signal IWT according to a burst length. The coupling block 200A may electrically couple the data lines DL and DLB and the bit lines BL and BLB in response to the column select signal YI.

The signal generation unit 120A may generate the drive signal DRV in response to the internal write signal IWT. The signal generation unit 120A may generate the drive signal DRV which corresponds to the column select signal YI.

The driver 300A may drive the data lines DL and DLB in response to the drive signal DRV to transmit data. Referring back to FIG. 3, as the data is transferred to the bit lines BL and BLB through the data lines DL and DLB, the voltage levels of the bit lines BL and BLB may be changed as indicated by dotted lines VL1.

The semiconductor apparatus 10 which is performing the write operation may be provided with the precharge command PCG from the external device. The semiconductor apparatus 10 may be provided with the precharge command PCG in the case where there is not any more for the write command WT to be successively executed. The command input unit 110A may generate the write strengthening signal WS in response to the precharge command PCG.

Referring once more to FIG. 2a, the signal generation unit 120A may extend the pulse width of the column select signal YI in response to the write strengthening signal WS. The signal generation unit 120A may extend the pulse width of the column select signals YI<2:3> generated in write operation periods occurring from when the precharge command PCG is provided to before the bit line precharge operation is performed. For example, the column select signals YI<2:3> may have a second pulse width W2.

Referring again to FIG. 2b, according to an embodiment, the signal generation unit 120A may extend the pulse width of the column select signal YI corresponding to the last write data in response to the write strengthening signal WS. The signal generation unit 120A may extend the pulse width of the column select signal YI<3> by identifying the last write operation period by referring to a burst length, in the case where the write strengthening signal WS is enabled. The column select signal YI<3> may be a signal generated to transmit the last write data to the bit lines BL and BLB.

Figure 2B:
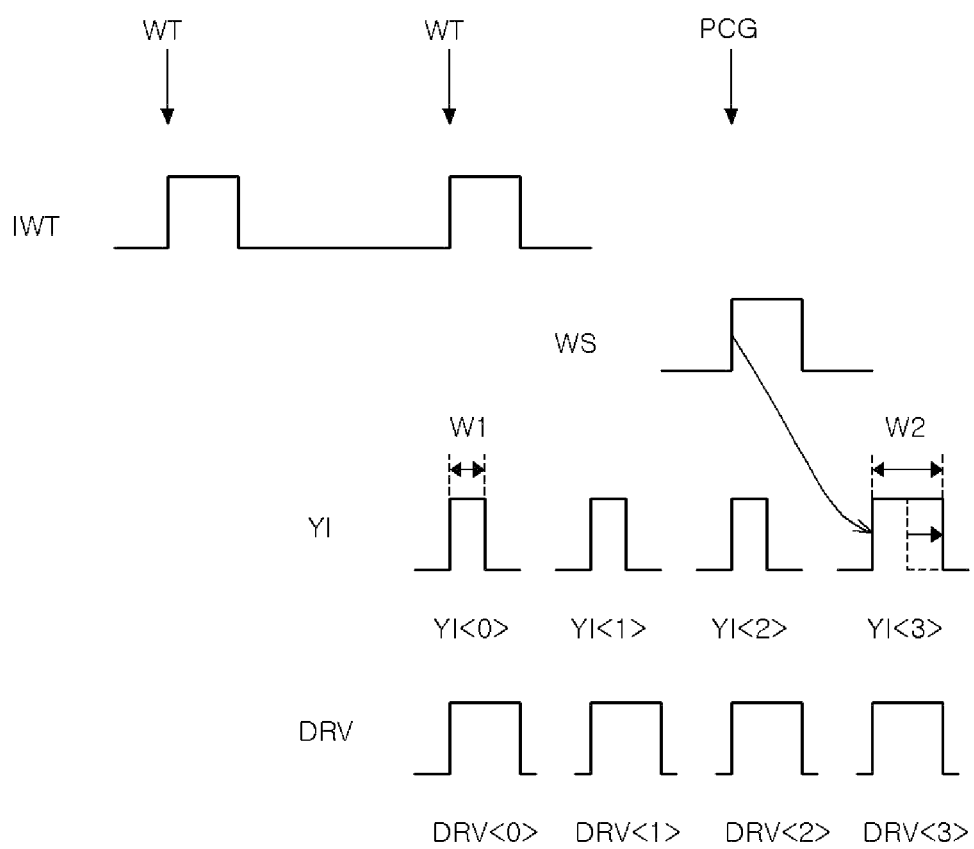
FIG. 2B is a representation of an example of a timing diagram to assist in the explanation of another operation method of the semiconductor apparatus shown in FIG. 1.
Figure 3:
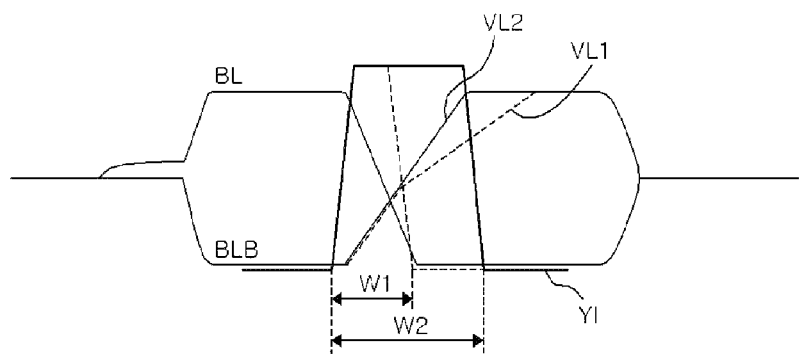
FIG. 3 is a representation of an example of a waveform diagram to assist in the explanation of changes in the voltage levels of bit lines.

The coupling block 200A may electrically couple the data lines DL and DLB and the bit lines BL and BLB in response to an extended column select signal (for example, the column select signal YI<3> of FIG. 2b). As the data is transferred to the bit lines BL and BLB through the data lines DL and DLB, the voltage levels of the bit lines BL and BLB may be changed. Referring back to FIG. 3, when the pulse width of the column select signal YI<3> is extended, since the longer driving time of the driver 300A may be secured, the voltage levels of the bit lines BL and BLB may be changed as indicated by solid lines VL2. As a result, write data may be quickly and stably stored in a memory cell.

Thereafter, the bit lines BL and BLB may be precharged by the bit line precharge operation.

Because the semiconductor apparatus 10 may quickly and stably write data, the precharge command PCG may be executed earlier. Accordingly, the operation performance of the semiconductor apparatus 10 may be improved.

Figure 4:
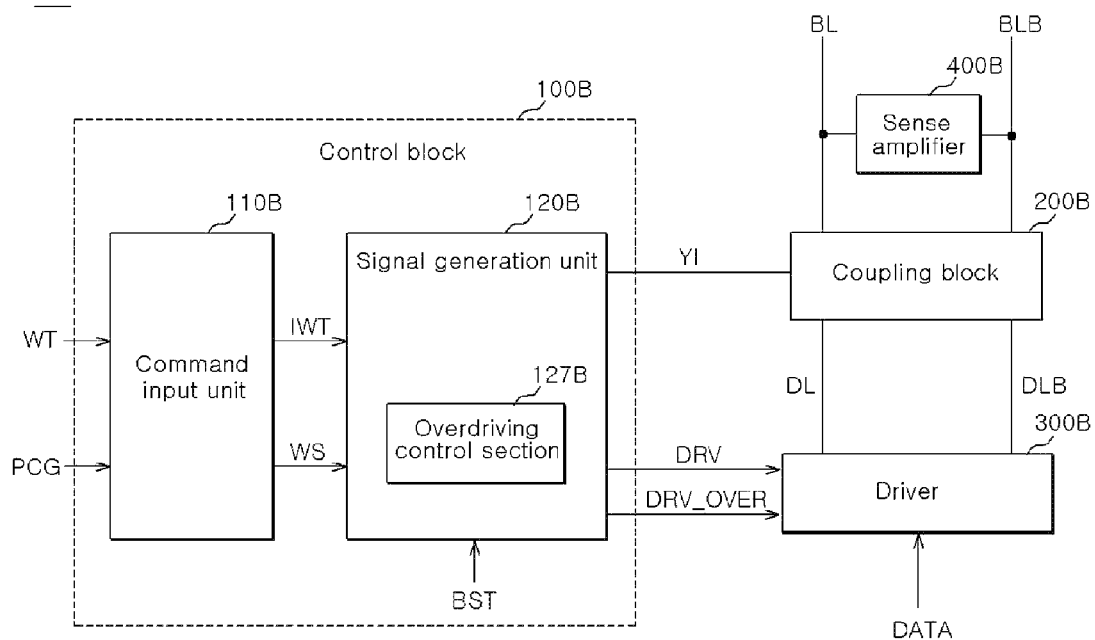
FIG. 4 is a block diagram schematically illustrating a representation of an example of a semiconductor apparatus in accordance with an embodiment.

Referring to FIG. 4, a block diagram schematically illustrating a representation of an example of a semiconductor apparatus 20 in accordance with an embodiment is described.

The semiconductor apparatus 20 may include a control block 100B configured to generate an overdrive signal DRV_OVER when a precharge command PCG is sensed. The semiconductor apparatus 20 may also include a driver 300B configured to overdrive data lines DL and DLB in response to the overdrive signal DRV_OVER.

The control block 100B may sense the precharge command PCG provided from an external device (not shown). The control block 100B may also generate the overdrive signal DRV_OVER, such that data may be quickly and stably stored in a memory cell before a bit line precharge operation by the precharge command PCG is performed. The control block 100B may generate the overdrive signal DRV_OVER in write operation periods occurring from when the precharge command PCG is provided to before the bit line precharge operation is performed.

According to an embodiment, the control block 100B may sense the precharge command PCG provided from the external device. Further, the control block 100B may generate the overdrive signal DRV_OVER in a last write operation period before the precharge operation is performed. The last write operation period may be an to operation period to write last write data in a memory cell before the bit line precharge operation by the precharge command PCG is performed. The last write data may be data to be written last before the bit line precharge operation is performed.

The control block 100B may include a command input unit 110B and a signal generation unit 120B.

The command input unit 110B may generate an internal write signal IWT in response to a write command WT provided from the external device. The command input unit 110B may generate a write strengthening signal WS in response to the precharge command PCG provided from the external device. More specifically, the command input unit 110B may generate the write strengthening signal WS in the case where the precharge command PCG is sensed.

The signal generation unit 120B may generate a drive signal DRV in response to the internal write signal IWT. The signal generation unit 120B may generate the overdrive signal DRV_OVER in response to the internal write signal IWT and the write strengthening signal WS. The signal generation unit 120B may generate the drive signal DRV in response to the internal write signal IWT until the write strengthening signal WS is generated. Further, the signal generation unit 120B may generate the overdrive signal DRV_OVER when the write strengthening signal WS is generated.

According to an embodiment, the signal generation unit 120B may generate the overdrive signal DRV_OVER corresponding to the last write data, in the last write operation period, in response to the internal write signal IWT and the write strengthening signal WS. The signal generation unit 120B may refer to, for example, burst length information, to identify the last write operation period.

The signal generation unit 120B may include an overdriving control section 127B configured to generate the overdrive signal DRV_OVER in response to the write strengthening signal WS.

The signal generation unit 120B may generate a column select signal YI in response to the internal write signal IWT.

The driver 300B may drive the data lines DL and DLB with a first voltage, that is, may perform normal driving, in response to the drive signal DRV, to transmit data. The driver 300B may overdrive the data lines DL and DLB with a second voltage higher than the first voltage, in response to the overdrive signal DRV_OVER. The data transmitted to the data lines DL and DLB may be transmitted to bit lines BL and BLB as a coupling block 200B electrically couples the data lines DL and DLB and the bit lines BL and BLB in response to the column select signal YI.

The semiconductor apparatus 20 may further include the coupling block 200B and a sense amplifier 400B. The coupling block 200B and the sense amplifier 400B may be configured and operate in substantially the same manner as the coupling block 200A and the sense amplifier 400A shown in FIG. 1.

Figure 5A:
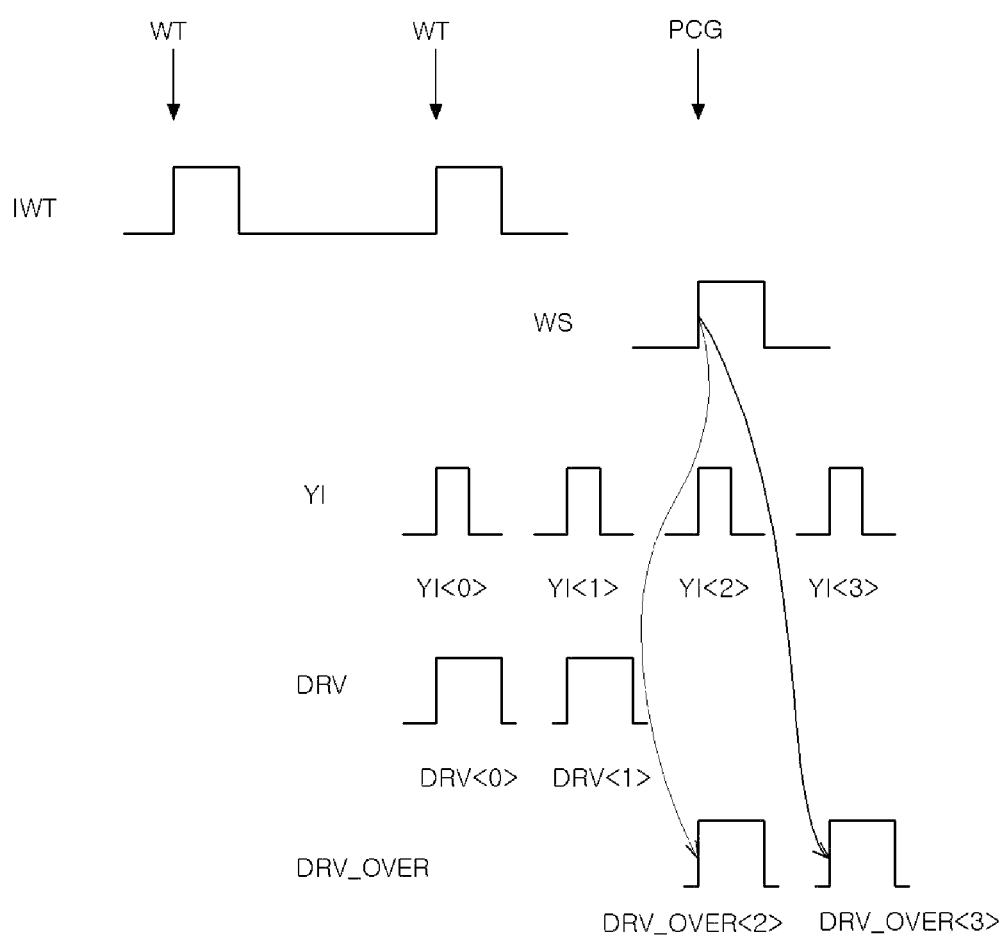
FIG. 5A is a representation of an example of a timing diagram to assist in the explanation of an operation method of the semiconductor apparatus shown in FIG. 4.
Figure 5B:
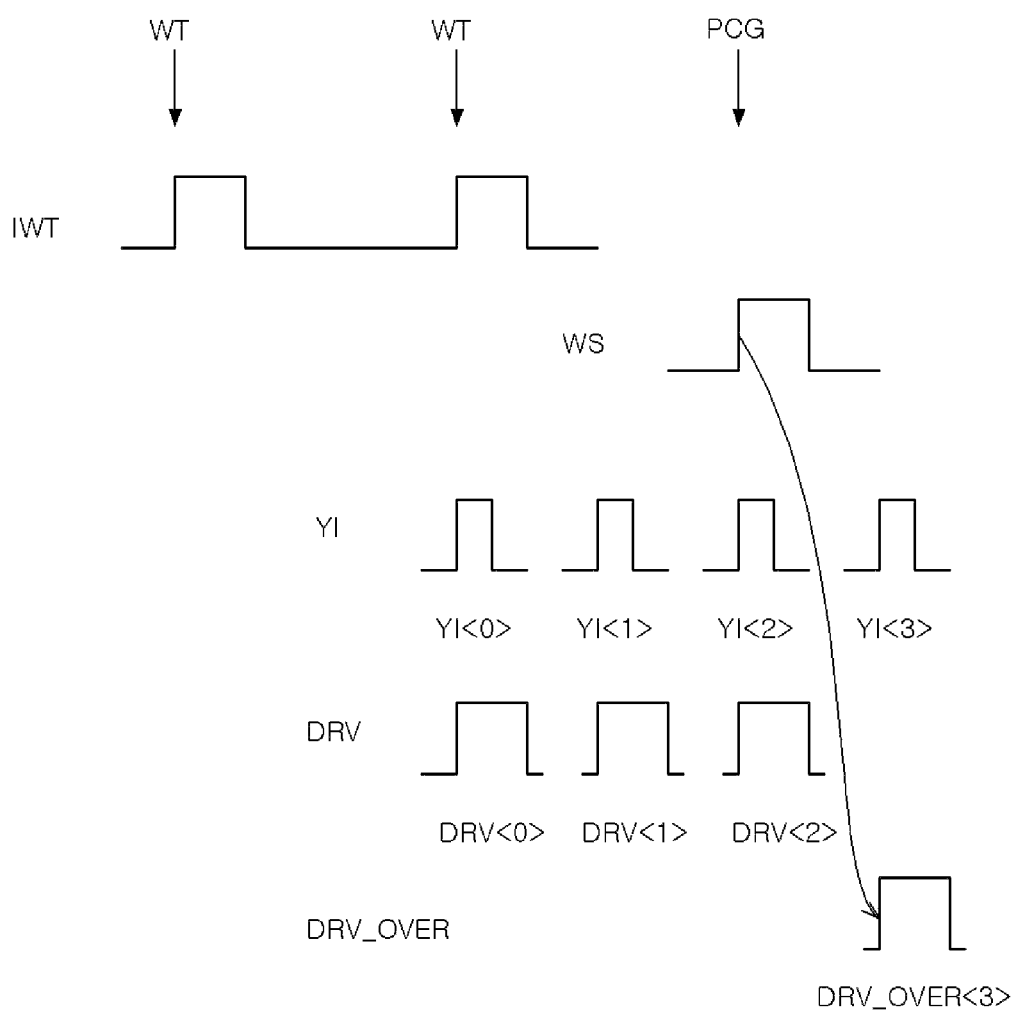
FIG. 5B is a representation of an example of a timing diagram to assist in the explanation of another operation method of the semiconductor apparatus shown in FIG. 4.
Figure 6:
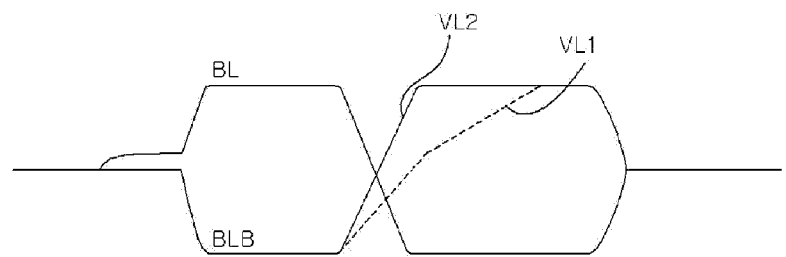
FIG. 6 is a representation of an example of a waveform diagram to assist in the explanation of changes in the voltage levels of bit lines.

Referring to FIG. 5a, a representation of an example of a timing diagram to assist in the explanation of an operation method of the semiconductor apparatus 20 shown in FIG. 4 is described. Referring to FIG. 5b, a representation of an example of a timing diagram to assist in the explanation of another operation method of the semiconductor apparatus 20 shown in FIG. 4 is described. Referring to FIG. 6, a representation of an example of a waveform diagram to assist in the explanation of changes in the voltage levels of the bit lines BL and BLB is described.

Hereinbelow, an operation method, for the semiconductor apparatus 20 performing a write operation in response to the write command WT to write quickly and stably write data in a memory cell before performing the bit line precharge operation in response to the precharge command PCG, will be described with reference to FIGS. 4, 5a, 5b and 6.

If the write operation is started, the bit lines BL and BLB which are precharged may be transferred with data from a memory cell through charge sharing. The sense amplifier 400B may sense and amplify the data loaded on the bit lines BL and BLB.

The command input unit 110B may generate the internal write signal IWT in response to the write command WT provided from the external device.

The signal generation unit 120B may generate the column select signal YI in response to the internal write signal IWT. The signal generation unit 120B may generate, for example, a plurality of column select signals YI<0:3> according to a burst length. The coupling block 200B may electrically couple the data lines DL and DLB and the bit lines BL and BLB in response to the column select signal YI.

The signal generation unit 120B may generate the drive signal DRV in response to the internal write signal IWT. The signal generation unit 120B may generate the drive signal DRV when the precharge command PCG is not yet provided to the semiconductor apparatus 20, that is, in the case where the write strengthening signal WS is not enabled. The signal generation unit 120B may generate drive signals DRV<0:1> which correspond to the column select signals YI<0:1>.

The driver 300B may normally drive the data lines DL and DLB in response to the drive signal DRV to transmit data. As the data is transferred to the bit lines BL and BLB through the data lines DL and DLB, the voltage levels of the bit lines BL and BLB may be changed. In this case, referring again to FIG. 6, the voltage levels of the bit lines BL and BLB may be changed as indicated by dotted lines VL1.

The semiconductor apparatus 20 which is performing the write operation may be provided with the precharge command PCG from the external device. The semiconductor apparatus 20 may be provided with the precharge command PCG when there is not any more for the write command WT to be successively executed. The command input unit 110B may generate the write strengthening signal WS in response to the precharge command PCG.

Referring back to FIG. 5a, the signal generation unit 120B may generate the overdrive signal DRV_OVER in response to the write strengthening signal WS. The signal generation unit 120B may generate overdrive signals DRV_OVER<2> and DRV_OVER<3> in write operation periods occurring from when the precharge command PCG is provided to before the bit line precharge operation is performed.

Referring again to FIG. 5b, according to an embodiment, the signal generation unit 120B may generate the overdrive signal DRV_OVER<3> in the last write operation period in response to the write strengthening signal WS. For instance, the signal generation unit 120B may generate the overdrive signal DRV_OVER<3> by identifying the last write operation period by referring to a burst length, in the case where the write strengthening signal WS is enabled. The overdrive signal DRV_OVER<3> may be a signal generated to transmit the last write data to the bit lines BL and BLB.

The driver 300B may overdrive the data lines DL and DLB in response to the overdrive signal DRV_OVER to transmit data. As the data is transferred to the bit lines BL and BLB through the data lines DL and DLB, the voltage levels of the bit lines BL and BLB may be changed. Referring again to FIG. 6, since the data lines DL and DLB may be overdriven, the voltage levels of the bit lines BL and BLB may be changed as indicated by solid lines VL2. As a result, write data may be quickly and stably stored in a memory cell.

Thereafter, the bit lines BL and BLB may be precharged by the bit line precharge operation.

Because the semiconductor apparatus 20 may quickly and stably write data, the precharge command PCG may be executed earlier. As a result, the operation performance of the semiconductor apparatus 20 may be improved.

Figure 7:
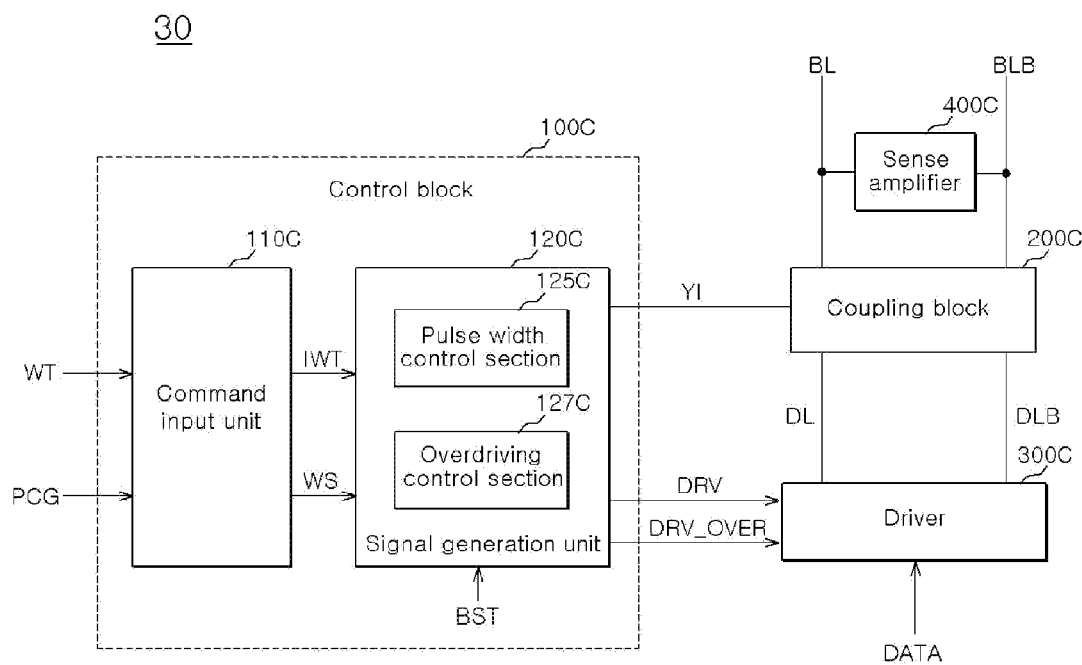
FIG. 7 is a block diagram schematically illustrating a representation of an example of a semiconductor apparatus in accordance with an embodiment.

Referring to FIG. 7, a block diagram schematically illustrating a representation of an example of a semiconductor apparatus 30 in accordance with an embodiment is described.

The semiconductor apparatus 30 may include a control block 100C configured to control the pulse width of a column select signal YI and generate an overdrive signal DRV_OVER in the case where a precharge command PCG is sensed. The semiconductor apparatus 30 may also include a coupling block 200C configured to electrically couple bit lines BL and BLB and data lines DL and DLB in response to the column select signal YI. Further, the semiconductor apparatus 30 may include a driver 300C configured to overdrive the data lines DL and DLB in response to the overdrive signal DRV_OVER.

The control block 100C may sense the precharge command PCG provided from an external device. In addition, the control block 100C may control the pulse width of the column select signal YI and generate the overdrive signal DRV_OVER, such that data may be quickly and stably stored in a memory cell before a bit line precharge operation by the precharge command PCG is performed. The control block 100C may control the pulse width of the column select signal YI and generate the overdrive signal DRV_OVER in write operation periods occurring from when the precharge command PCG is provided to before the bit line precharge operation is performed.

According to an embodiment, the control block 100C may sense the precharge command PCG provided from the external device. Further, the control block 100C may control the pulse width of the column select signal YI and generate the overdrive signal DRV_OVER in a last write operation period before the precharge operation is is performed.

The control block 100C may include a command input unit 110C and a signal generation unit 120C.

The command input unit 110C may be configured and operate in substantially the same manner as the command input unit 110A shown in FIG. 1.

The signal generation unit 120C may control the pulse width of the column select signal YI and generate the overdrive signal DRV_OVER in response to a write strengthening signal WS. According to an embodiment, the signal generation unit 120C may control the pulse width of the column select signal YI corresponding to last write data and generate the overdrive signal DRV_OVER, in the last write operation period, in response to the write strengthening signal WS. The signal generation unit 120C may refer to, for example, burst length information, to identify the last write operation period.

The signal generation unit 120C may include a pulse width control section 125C and an overdriving control section 127C. The pulse width control section 125C and the overdriving control section 127C may be configured and operate in substantially the same manner as the pulse width control section 125A shown in FIG. 1 and to the overdriving control section 127B shown in FIG. 4, respectively.

The semiconductor apparatus 30 may further include a driver 300C. The driver 300C may be configured and operate in substantially the same manner as the driver 300B shown in FIG. 4.

The semiconductor apparatus 30 may further include a coupling block 200C and a sense amplifier 400C. The coupling block 200C and the sense amplifier 400C may be configured and operate in substantially the same manner as the coupling block 200A and the sense amplifier 400A shown in FIG. 1.

Because an operation method, for the semiconductor apparatus 30 to perform a write operation in response to the write command WT and write quickly and stably write data in a memory cell before performing the bit line precharge operation in response to the precharge command PCG, is substantially similar to the operation methods of the semiconductor apparatus 10 of FIG. 1 and the semiconductor apparatus 20 of FIG. 4, detailed descriptions will be omitted.

Figure 8:
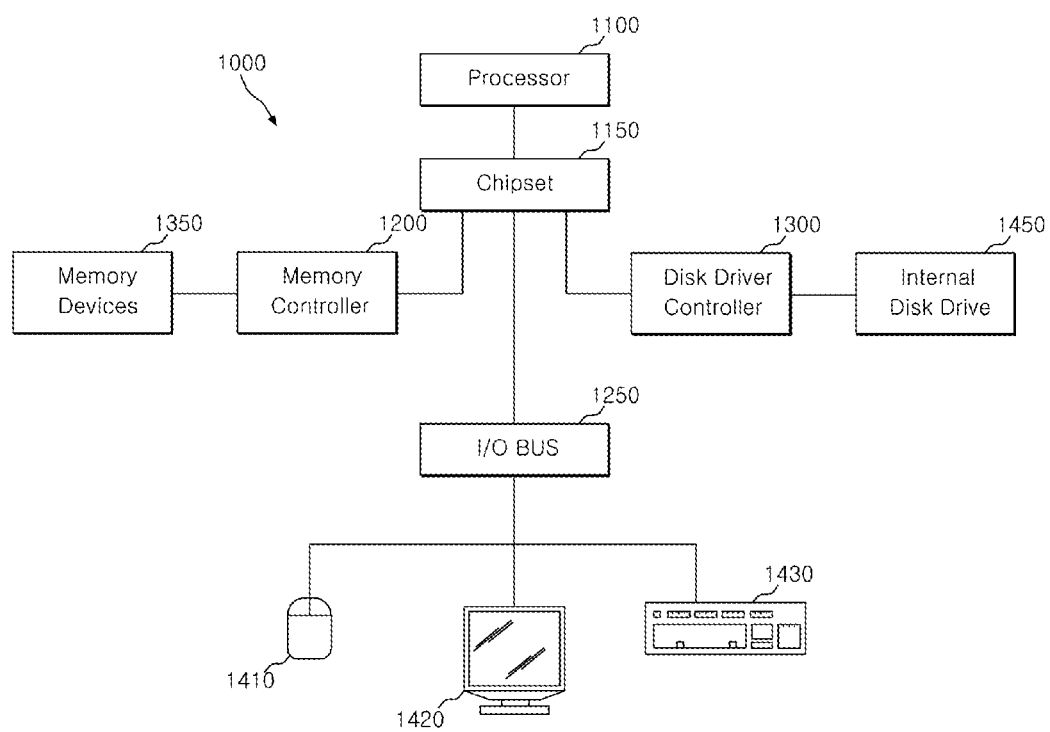
FIG. 8 illustrates a block diagram of a system employing a memory controller circuit in accordance with an embodiment of the to invention.

Referring to FIG. 8, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components of the system 1000 may include a memory controller 1200, an input/output ("I/O") bus 1250, and a disk drive controller 1300. Depending on the to configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory device 1350 may include the semiconductor apparatus described above.

The chipset 1150 may also be electrically coupled to the I/O bus 1250. The I/O bus 1250 may serve as a communication pathway for signals from the chipset 1150 to I/O devices 1410, 1410 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

While various embodiments have been described above, it will be understood to those skilled in the art that the embodiments described are by way of example only. Accordingly, the semiconductor apparatus described should not be limited based on to the described embodiments.

What is claimed is:

1. A semiconductor apparatus comprising:
    a control block configured to control a pulse width of a column select signal of column select signals for a write operation, in response to a precharge command from an external; and
    a coupling block configured to electrically couple bit lines and data lines according to the column select signal,
    wherein the pulse width of the column select signal is wider than pulse widths of other column select signals of the column select signals.

2. The semiconductor apparatus according to claim 1, wherein the control block comprises:
    a command input unit configured to generate a write strengthening signal in response to the precharge command; and
    a signal generation unit configured to control the pulse width of the column select signal in response to the write strengthening signal.

3. The semiconductor apparatus according to claim 2, wherein the command input unit generates an internal write signal in response to a write command, and
    wherein the signal generation unit generates the column select signal in response to the internal write signal.

4. The semiconductor apparatus according to claim 2, wherein the signal generation unit extends the pulse width of the column select signal only in a last write operation period when the write strengthening signal is enabled.

5. The semiconductor apparatus according to claim 4, wherein the signal generation unit refers to a burst length information to identify the last write operation period.

6. The semiconductor apparatus according to claim 1, further comprising:
    a driver configured to transmit data to the data lines in response to the column select signal.

7. A semiconductor apparatus comprising:
    a control block configured to generate a drive signal in response to a write command and generate an overdrive signal in response to a precharge command; and
    a driver configured to drive data lines with a first voltage in response to the drive signal and overdrive the data lines with a second voltage higher than the first voltage in response to the overdrive signal,
    wherein the control block provides the drive signal to the driver to perform a first write operation based on the write command before receiving the precharge command and provides the overdrive signal to the driver to perform a second write operation based on the write command after receiving the precharge command.

8. The semiconductor apparatus according to claim 7, wherein the control block comprises:
    a command input unit configured to generate an internal write signal in response to the write command, and generate a write strengthening signal in response to the precharge command; and
    a signal generation unit configured to generate the overdrive signal in response to the internal write signal and the write strengthening signal.

9. The semiconductor apparatus according to claim 8,
    wherein the signal generation unit generates the drive signal until the write strengthening signal is generated in response to the internal write signal, and
    wherein the driver drives the data lines in response to the drive signal.

10. The semiconductor apparatus according to claim 8, wherein the signal generation unit generates the overdrive signal in a last write operation period in response to the write strengthening signal.

11. The semiconductor apparatus according to claim 10, wherein the signal generation unit refers to a burst length information to identify the last write operation period.

12. The semiconductor apparatus according to claim 8, further comprising:
    a coupling block configured to electrically couple bit lines and the data lines according to a column select signal,
    wherein the signal generation unit generates the column select signal according to the internal write signal.

13. A semiconductor apparatus comprising:
    a control block configured to generate column select signals and a drive signal in response to a write command, control a pulse width of a column select signal of the column select signals and generate an overdrive signal in response to a precharge command;
    a driver configured to drive data lines with a first voltage in response to the drive signal and overdrive the data lines with a second voltage higher than the first voltage according to the overdrive signal; and
    a coupling block configured to electrically couple bit lines and the data lines according to the column select signals, wherein the pulse width of the column select signal is wider than pulse widths of other column select signals of the column select signals.

14. The semiconductor apparatus according to claim 13, wherein the control block comprises:
   a command input unit configured to generate an internal write signal in response to the write command and generate a write strengthening signal in response to the precharge command; and
   a signal generation unit configured to generate the column select signals in response to the internal write signal and control the pulse width of the column select signal in response to the write strengthening signal.

15. The semiconductor apparatus according to claim 14, wherein the signal generation unit extends the pulse width of the column select signal only in a last write operation period identified by referring to a burst length information when the write strengthening signal is enabled.

16. The semiconductor apparatus according to claim 14, wherein the signal generation unit generates the overdrive signal in response to the internal write signal and the write strengthening signal.

17. The semiconductor apparatus according to claim 14, wherein the signal generation unit generates the drive signal in response to the internal write signal until the write strengthening signal is generated, and
   wherein the driver drives the data lines in response to the drive signal.

18. The semiconductor apparatus according to claim 14, wherein the signal generation unit generates the overdrive signal in the last write operation period identified by referring to a burst length information in response to the write strengthening signal.

19. The semiconductor apparatus according to claim 13, wherein the control block generates the overdrive signal before a bit line precharge operation by the precharge command is performed.

20. The semiconductor apparatus according to claim 13, wherein the driver transmits data to the bit lines to change voltage levels of the bit lines.

* * * * *